(12) United States Patent
Goyal

(10) Patent No.: US 12,298,872 B2
(45) Date of Patent: *May 13, 2025

(54) GLITCH SUPPRESSION APPARATUS AND METHOD

(71) Applicant: STMicroelectronics International N.V., Geneva (CH)

(72) Inventor: Avneep Kumar Goyal, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 42 days.

This patent is subject to a terminal disclaimer.

(21) Appl. No.: 18/317,420

(22) Filed: May 15, 2023

(65) Prior Publication Data

US 2023/0281092 A1 Sep. 7, 2023

Related U.S. Application Data

(63) Continuation of application No. 17/152,901, filed on Jan. 20, 2021, now Pat. No. 11,687,428.

(51) Int. Cl.
  *G06F 11/00* (2006.01)
  *G06F 1/06* (2006.01)
  *G06F 11/22* (2006.01)
  *G06F 11/263* (2006.01)

(52) U.S. Cl.
  CPC .............. *G06F 11/263* (2013.01); *G06F 1/06* (2013.01); *G06F 11/2236* (2013.01)

(58) Field of Classification Search
  CPC .............. G06F 11/263; G06F 11/2236; G06F 11/0724; G06F 11/1629; G06F 11/1641; G06F 11/1625; G06F 11/1675; G06F 11/1679; G06F 11/18; G06F 11/2242; G06F 11/3024; G06F 1/06
  See application file for complete search history.

(56) References Cited

U.S. PATENT DOCUMENTS

| | | | |
|---|---|---|---|
| 5,537,655 A * | 7/1996 | Truong | G06F 11/1679 307/409 |
| 5,748,034 A | 5/1998 | Ketineni et al. | |
| 5,892,897 A | 4/1999 | Carlson et al. | |
| 6,393,582 B1 | 5/2002 | Klecka et al. | |
| 8,090,984 B2 | 1/2012 | Moyer et al. | |
| 9,363,071 B2 | 6/2016 | Sengoku et al. | |
| 9,417,946 B2 | 8/2016 | Vilela et al. | |

(Continued)

FOREIGN PATENT DOCUMENTS

| | | |
|---|---|---|
| WO | 2009010321 A1 | 1/2009 |
| WO | 2020016550 A1 | 1/2020 |

*Primary Examiner* — Joseph D Manoskey
(74) *Attorney, Agent, or Firm* — Slater Matsil, LLP

(57) ABSTRACT

An apparatus includes a main core processor configured to receive a first signal through a first main buffer, a second signal through a second main buffer, a third signal through a third main buffer, and a fourth signal through a fourth main buffer, a shadow core processor configured to receive the first signal through a first shadow buffer, the second signal through a second shadow buffer, the third signal through a third shadow buffer and the fourth signal through a fourth shadow buffer, and a first glitch suppression buffer coupled to a common node of an input of the first main buffer and an input of the first shadow buffer.

20 Claims, 4 Drawing Sheets

(56) References Cited

U.S. PATENT DOCUMENTS

| | | | |
|---|---|---|---|
| 10,523,205 B1 * | 12/2019 | Tsai | H03K 19/0944 |
| 2008/0244305 A1 | 10/2008 | Troppmann et al. | |
| 2019/0391888 A1 * | 12/2019 | Meriac | G06F 11/1497 |
| 2020/0019477 A1 | 1/2020 | Jain et al. | |
| 2022/0245011 A1 * | 8/2022 | Jain | G06F 11/0724 |
| 2023/0208410 A1 * | 6/2023 | Hong | H03K 5/1252 |
| | | | 327/294 |

* cited by examiner

GLITCH SUPPRESSION APPARATUS AND METHOD

CROSS-REFERENCE TO RELATED APPLICATIONS

This application is a continuation of U.S. application Ser. No. 17/152,901, filed on Jan. 20, 2021, which application is hereby incorporated by reference herein in its entirety.

TECHNICAL FIELD

The present invention relates generally to a glitch suppression apparatus and method in a dual-core lockstep system.

BACKGROUND

As the automotive industry continues to expand, and the volume of automobiles increases, there is a growing need for System-on-Chip (SoC) semiconductor devices designed for safety-critical applications. Reliability is a critical concern for meeting the safety requirements of a range of automotive applications including advanced driver assistance systems, electric power steering systems, adaptive cruise control systems, braking control systems, and the like.

In safety-critical applications, a system error may occur in a computer system. If this system error is not detected and promptly corrected, it may cause hangs and crashes in the computer system. A dual-core lockstep computer system is employed to detect the system error so as to prevent computer system crashes from occurring.

The dual-core lockstep computer system comprises a main core processor and a shadow core processor configured to operate in lockstep. Both the main core processor and the shadow core processor are configured to receive the same input data and execute the same instruction of the same program code at any given time. After the execution of every instruction, the result from the main core processor is compared with the result of the shadow core processor. If any mismatch is found in the results of these two core processors, it indicates there is a fault in the computer system. Consequently, the computer system enters into a defined safe mode.

In the dual-core lockstep computer system, many timing buffers are placed on the clock, reset, test signals, and data signals. These timing buffers may cause glitches in the dual-core lockstep computer system. The dual-core lockstep computer system is designed to catch the system fault. However, the faults (e.g., single event upset transition faults) occurring on the common paths of the clock, reset, and test signals are not detectable. The faults occurring on the common paths may result in reliability issues. It is desirable to have a simple and reliable glitch suppression apparatus to keep the computer system operating reliably.

SUMMARY

In accordance with an embodiment, an apparatus comprises a main core processor configured to receive a first signal through a first main buffer, a second signal through a second main buffer, a third signal through a third main buffer, and a fourth signal through a fourth main buffer, a shadow core processor configured to receive the first signal through a first shadow buffer, the second signal through a second shadow buffer, the third signal through a third shadow buffer and the fourth signal through a fourth shadow buffer, and a first glitch suppression buffer coupled to a common node of an input of the first main buffer and an input of the first shadow buffer.

In accordance with another embodiment, a method comprises placing a first glitch suppression buffer at an end of a first common signal path to suppress glitches of a first signal before the first signal flows into two different signal paths coupled to a main core processor and a shadow core processor, respectively, placing a second glitch suppression buffer at an end of a second common signal path to suppress glitches of a second signal before the second signal flows into two different signal paths coupled to the main core processor and the shadow core processor, respectively, and placing a third glitch suppression buffer at an end of a third common signal path to suppress glitches of a third signal before the third signal flows into two different signal paths coupled to the main core processor and the shadow core processor, respectively.

In accordance with yet another embodiment, a system comprises a plurality of glitch suppression buffers configured to suppress a plurality of glitches of a plurality of signals, each of the plurality of glitch suppression buffers being placed at an end of a common path of a corresponding signal before the corresponding signal is routed to two different paths, a main core processor configured to receive the plurality of signals through a plurality of main buffers, a shadow core processor configured to receive the plurality of signals through a plurality of shadow buffers, and a fault control unit configured to compare an output signal of the main core processor with an output signal of the shadow core processor and detect whether the output signal of the main core processor matches the output signal of the shadow core processor.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions, and alterations can be made herein without departing from the spirit and scope of this disclosure as defined by the appended claims.

The present disclosure will be described with respect to preferred embodiments in a specific context, namely a glitch suppression apparatus in a dual-core lockstep system. The present disclosure may also be applied, however, to a variety of safety-critical applications. Hereinafter, various embodiments will be explained in detail with reference to the accompanying drawings.

Figure 1:
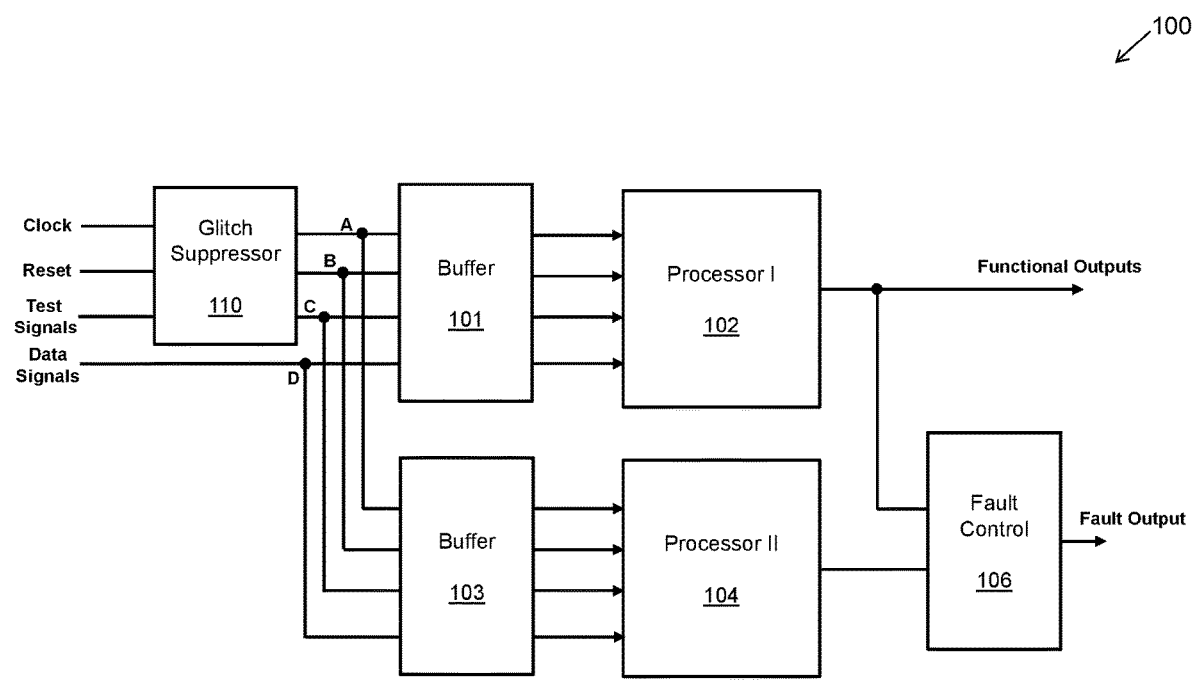
FIG. 1 illustrates a block diagram of a dual-core lockstep system in accordance with various embodiments of the present disclosure.

FIG. 1 illustrates a block diagram of a dual-core lockstep system in accordance with various embodiments of the present disclosure. The dual-core lockstep system 100 comprises a first processor 102, a second processor 104, a first buffer 101, a second buffer 103, a fault control unit 106, and a glitch suppressor 110. The dual-core lockstep system 100 is configured to receive a clock signal, a reset signal, a plurality of test signals, and a plurality of data signals. Based on the received signals, the dual-core lockstep system 100 generates a plurality of functional output signals and a fault output signal.

The clock signal is generated by a clock generator (not shown). The clock signal is employed to condition a plurality of intellectual property (IP) components (e.g., communication IP, timer IP, and memory IP). It should be noted that FIG. 1 illustrates only one clock signal. It is merely an example. The dual-core lockstep system 100 may include a plurality of clock signals. The clock signal illustrated herein is limited solely for the purpose of clearly illustrating the inventive aspects of the various embodiments.

The reset signal is employed to reset different parts of the dual-core lockstep system 100 before the start of functional operation. It should be noted that FIG. 1 illustrates only one reset signal. It is merely an example. Depending on design needs, the dual-core lockstep system 100 may include a plurality of reset signals.

The test signals are used when the dual-core lockstep system 100 is configured to operate in a test mode. The data signals are used when the dual-core lockstep system 100 is configured to operate in a functional mode. The data signals are generated by a variety of IPs and fed into the first processor 102 and second processor 104, respectively. The first processor 102 processes the data signals and feed the processed data signals to a plurality of IPs connected to the output of the first processor 102.

As shown in FIG. 1, the clock signal flows through a common signal path. At node A, the clock signal flows into two different signal paths coupled to the first processor 102 and the second processor 104, respectively. Likewise, the reset signal flows through a common signal path. At node B, the reset signal flows into two different signal paths coupled to the first processor 102 and the second processor 104, respectively. The plurality of test signals flows through a common signal path. At node C, the plurality of test signals flows into two different signal paths coupled to the first processor 102 and the second processor 104, respectively. The plurality of data signals flows through a common signal path. At node D, the plurality of data signals flows into two different signal paths coupled to the first processor 102 and the second processor 104, respectively.

In some embodiments, the first processor 102 and the second processor 104 are two identical processors. These two processors are reset in the same states and fed with identical input signals. If these two processors operate correctly, identical outputs are generated by these two processors. In operation, a failure may occur and reach the output of one of these two processors. This failure can be detected by comparing the outputs of the two processors. After detecting such a failure, the dual-core lockstep system 100 may take appropriate actions to handle the failure so as to prevent the system from being crashed. In some embodiments, the first processor 102 is configured to perform the system operations. The second processor 104 is configured to confirm the correctness of the operation of the first processor 102. Throughout the description, the first processor 102 may be alternatively referred to as a main core processor 102. The second processor 104 may be referred to as a shadow core processor 104.

The first buffer 101 comprises a plurality of buffers. Depending on design needs, the plurality of buffers is added on different signal paths connected to the main core processor 102. Each buffer of the plurality of buffers may be implemented as two inverters connected in cascade. Throughout the description, the buffers added on the signal paths connected to the main core processor 102 may be alternatively referred to as a plurality of main buffers. The detailed schematic diagram of the first buffer 101 will be described below with respect to FIG. 2.

The second buffer 103 comprises a plurality of buffers. Depending on design needs, the plurality of buffers is added on different signal paths connected to the shadow core processor 104. Each buffer of the plurality of buffers may be implemented as two inverters connected in cascade. Throughout the description, the buffers added on the signal paths connected to the shadow core processor 104 may be alternatively referred to as a plurality of shadow buffers. The detailed schematic diagram of the second buffer 103 will be described below with respect to FIG. 2.

As shown in FIG. 1, the glitch suppressor 110 is placed on the common paths of the clock signal, the reset signal, and the test signals. In particular, the glitch suppressor is placed at an end of a common signal path. The glitch suppressor 110 is employed to eliminate glitches occurred on the common signal paths. The detailed schematic diagram of the glitch suppressor 110 will be discussed below with respect to FIGS. 2-3.

The fault control unit 106 comprises a comparison unit. In some embodiments, the comparison unit is implemented as a comparator. The comparison unit has a first input connected to the output of the main core processor 102, and a second input connected to the output of the shadow core processor 104. The fault control unit 106 is configured to compare an output signal of the main core processor 102 with an output signal of the shadow core processor 104 and detect whether the output signal of the main core processor 102 matches the output signal of the shadow core processor 104. If any mismatch is found in the results of these two core processors, there is a fault in the dual-core lockstep system. Consequently, the dual-core lockstep system enters into a defined safe mode.

Figure 2:
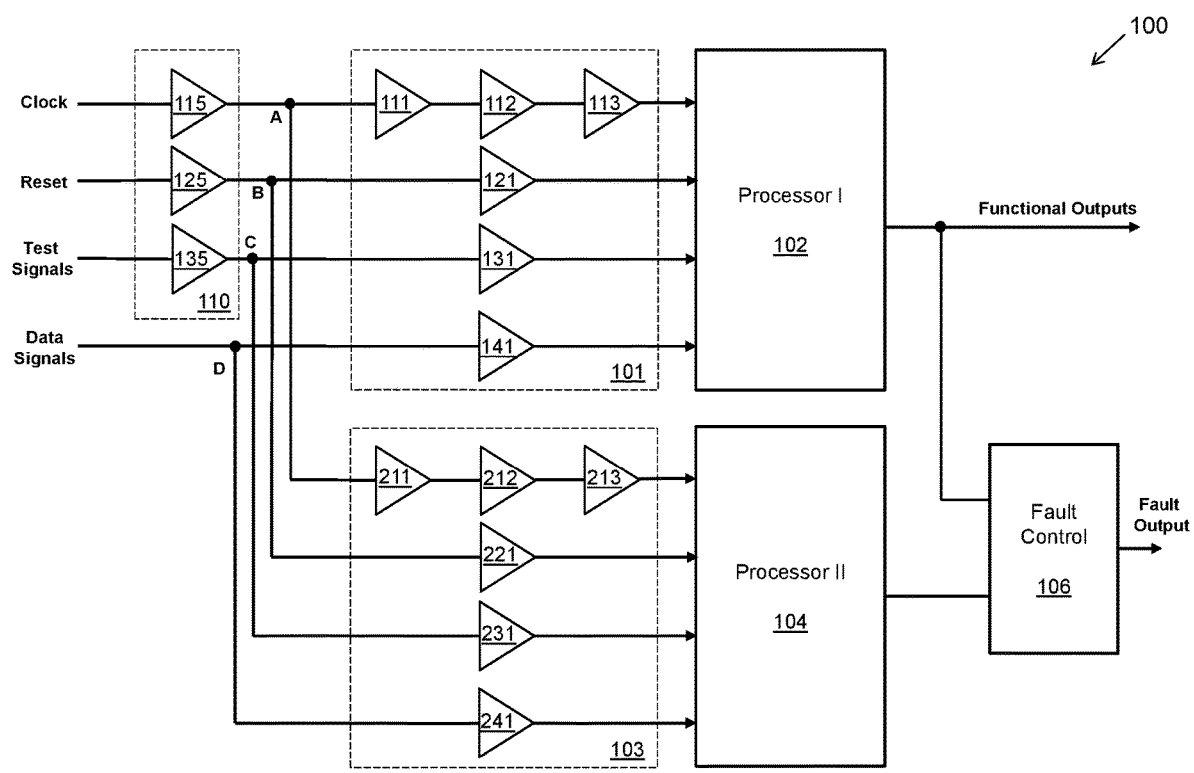
FIG. 2 illustrates a schematic diagram of the dual-core lockstep system shown in FIG. 1 in accordance with various embodiments of the present disclosure.

FIG. 2 illustrates a schematic diagram of the dual-core lockstep system shown in FIG. 1 in accordance with various embodiments of the present disclosure. The glitch suppressor 110 comprises a plurality of glitch suppression buffers 115, 125, and 135 configured to suppress a plurality of glitches that occurred on the clock, reset, and test signals. More particularly, a first glitch suppression buffer 115 is employed to suppress the glitches occurred on the clock signal. A second glitch suppression buffer 125 is employed to suppress the glitches that occurred on the reset signal. A third glitch suppression buffer 135 is employed to suppress the glitches that occurred on the plurality of test signals.

As shown in FIG. 2, the first glitch suppression buffer 115 is placed at an end of a common path of the clock signal before the clock signal is fed into two different paths. At node A, the clock signal leaves the common path and reaches the main core processor and the shadow core processor through two different paths. As shown in FIG. 2, the first path coupled between node A and the main core processor 102 comprises buffers 111, 112, and 113. A second path coupled between node B and the shadow core processor 104 comprises buffers 211, 212, and 213.

At node B, the reset signal leaves the common path and reaches the main core processor 102 and the shadow core processor 104 through two different paths. As shown in FIG. 2, a first path coupled between node B and the main core processor 102 comprises a buffer 121. A second path coupled between node B and the shadow core processor 104 comprises a buffer 221. At node C, the plurality of test signals leaves the common path and reaches the main core processor 102 and the shadow core processor 104 through two different paths. As shown in FIG. 2, the first path coupled between node C and the main core processor 102 comprises a buffer 13L A second path coupled between node C and the shadow core processor 104 comprises a buffer 231.

At node D, the plurality of data signals leaves the common path and reaches the main core processor 102 and the shadow core processor 104 through two different paths. As shown in FIG. 2, the first path coupled between node D and the main core processor 102 comprises a buffer 141. A second path coupled between node D and the shadow core processor 104 comprises a buffer 241.

The buffers (e.g., buffers 111-113, 121, 131, 141, 211-213, 221, 231, and 241) are employed to control the timing of the signals fed into the main core processor 102 and the shadow core processor 104. The buffers may be implemented as two inverters connected in cascade.

One advantageous feature of having the glitch suppression buffers 115, 125, and 135 is that the glitch suppression buffers are added only on the clock, reset, and test signal paths. These glitch suppression buffers help to suppress the transition faults that occur on the common signal paths. There are fewer number of the clock, reset, and test signals in the input of a dual-core lockstep system in comparison with the data inputs. Adding the glitch suppression buffers only on the clock, reset and test signal paths helps to reduce the semiconductor area of the dual-core lockstep system. Furthermore, in comparison with the conventional glitch suppression apparatus having delay stage flip-flops on all the signal paths, the system shown in FIG. 2 allows the removal of delay stage flip-flops, thereby simplifying the system to make it more reliable.

Figure 3:
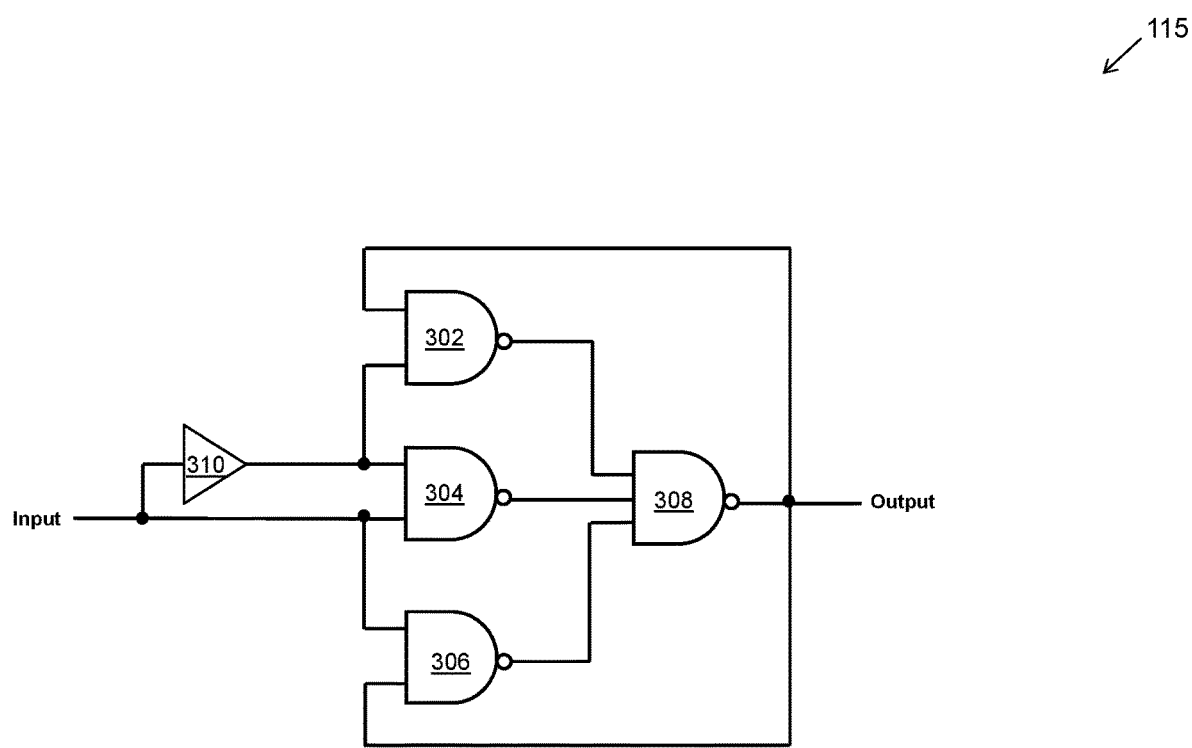
FIG. 3 illustrates a schematic diagram of the glitch suppression buffer shown in FIG. 2 in accordance with various embodiments of the present disclosure.

FIG. 3 illustrates a schematic diagram of the glitch suppression buffer shown in FIG. 2 in accordance with various embodiments of the present disclosure. The glitch suppression buffers 115, 125, and 135 are of the same structure. The glitch suppression buffer 115 is used as an example herein for simplicity.

As shown in FIG. 3, the glitch suppression buffer 115 comprises a first NAND gate 302, a second NAND gate 304, a third NAND gate 306, a fourth NAND gate 308, and a delay buffer 310.

The first NAND gate 302 has a first input connected to an output of the glitch suppression buffer 115, a second input connected to an output of the delay buffer 310, and an output connected to a first input of the fourth NAND gate 308.

The second NAND gate 304 has a first input connected to the second input of the first NAND gate 302, a second input connected to an input of the glitch suppression buffer 115, and an output connected to a second input of the fourth NAND gate 308.

The third NAND gate 306 has a first input connected to the input of the glitch suppression buffer 115, a second input connected to the output of the glitch suppression buffer 115, and an output connected to a third input of the fourth NAND gate 308.

The fourth NAND gate 308 has a first input connected to the output of the first NAND gate 302, a second input connected to the output of the second NAND gate 304, a third input connected to the output of the third NAND gate 306, and an output connected to the output of the glitch suppression buffer 115.

The delay buffer 310 is connected between the input of the glitch suppression buffer 115 and the first input of the second NAND gate.

In operation, when the input signal of the glitch suppression buffers 115 is of a logic low state, the output of the glitch suppression buffer 115 generates a logic low signal. A glitch (e.g., a logic high glitch) may occur at the input of the glitch suppression buffer 115. The delay buffer 310 delays the incoming glitch and generates a delayed glitch at the output of the delay buffer 310.

At a first time instant, the glitch reaches the second input of the second NAND gate 304 and the first input of the third NAND gate 306. Due to the delay generated by the delay buffer 310, a logic low signal is generated at the output of the delay buffer 310 at the first time instant. This logic low signal is applied to the second input of the first NAND gate 302 and the first input of the second NAND gate 304. As shown in FIG. 3, the output of the glitch suppression buffer 115 is fed into the first input of the first NAND gate 302 and the second input of the third NAND gate 306. According to the operating principle of the NAND gate, the NAND gates 302, 304, and 306 all generate a logic high signal at the first time instant. The fourth NAND gate 308 maintains the logic low state at the first time instant.

After the glitch passes through the glitch suppression buffer 115, in a second time instant, the delayed glitch reaches the second input of the first NAND gate 302 and the first input of the second NAND gate 304. The logic low signal is applied to the first input of the first NAND gate 302, the second input of the second NAND gate 304, and the inputs of the third NAND gate 306. According to the operating principle of the NAND gate, the NAND gates 302, 304, and 306 all generate a logic high signal at the first time instant. The fourth NAND gate 308 maintains the logic low state at the second time instant. As such, the glitch is eliminated or absorbed by the glitch suppression buffer 115.

In operation, when the input signal is of a logic high state, the output of the glitch suppression buffer 115 generates a logic high signal. A glitch (e.g., a logic low glitch) may occur at the input of the glitch suppression buffer 15. The glitch suppression buffer 115 is able to eliminate this logic low glitch and maintain the logic high state. The operating principle of eliminating this logic low glitch is similar to that described above and hence is not discussed herein again.

It should be noted that the glitch suppression buffer shown in FIG. 3 is merely an example, which should not unduly limit the scope of the claims. One of ordinary skill in the art would recognize many variations, alternatives, and modifications.

Figure 4:
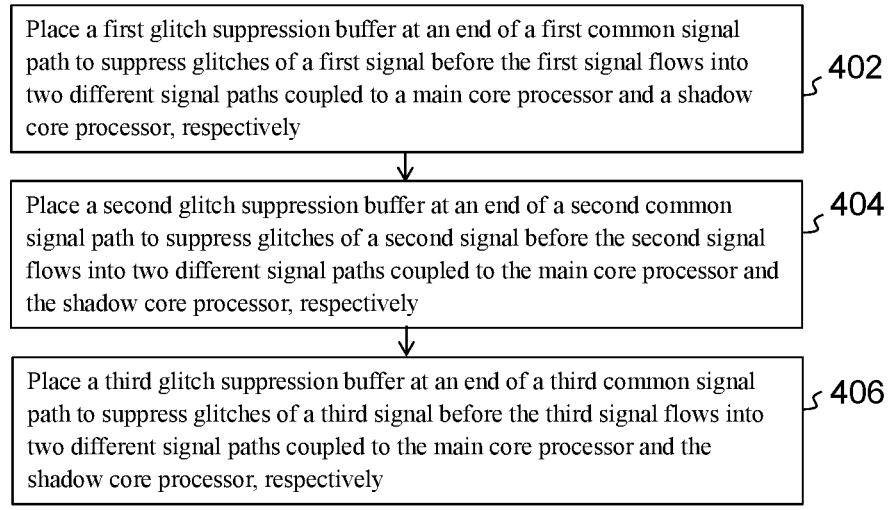
FIG. 4 illustrates a flow chart of a method for suppressing the glitches in the dual-core lockstep system shown in FIG. 1 in accordance with various embodiments of the present disclosure.

FIG. 4 illustrates a flow chart of a method for suppressing the glitches in the dual-core lockstep system shown in FIG. 1 in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged, and repeated.

A dual-core lockstep system comprises a main core processor (e.g., processor I in FIGS. 1-2) and a shadow core processor (e.g., processor II in FIGS. 1-2). Both the main core processor and the shadow core processor are configured to receive the same input signals including a clock signal, a reset signal, a plurality of test signals, and a plurality of data signals.

The clock signal flows through a common clock signal path. At the first node (e.g., node A in FIGS. 1-2), the clock signal is routed to two different signal paths connected to the main core processor and the shadow core processor, respectively. For controlling the timing of the clock signal fed into the main core processor, a plurality of first main buffers (e.g., buffers 111, 112, and 113 in FIG. 2) is placed in the signal path between the first node and the main core processor. For controlling the timing of the clock signal fed into the shadow core processor, a plurality of first shadow buffers (e.g., buffers 211, 212, and 213 in FIG. 2) is placed in the signal path between the first node and the shadow core processor.

The reset signal flows through a common reset signal path. At a second node (e.g., node B in FIGS. 1-2), the reset signal is routed to two different signal paths connected to the main core processor and the shadow core processor, respectively. For controlling the timing of the reset signal fed into the main core processor, a second main buffer (e.g., buffer 121 in FIG. 2) is placed in the signal path between the second node and the main core processor. For controlling the timing of the reset signal fed into the shadow core processor, a second shadow buffer (e.g., buffer 221 in FIG. 2) is placed in the signal path between the second node and the shadow core processor.

The plurality of test signals flows through a common test signal path. At a third node (e.g., node C in FIGS. 1-2), the plurality of test signals is routed to two different signal paths connected to the main core processor and the shadow core processor, respectively. For controlling the timing of the plurality of test signals fed into the main core processor, a third main buffer (e.g., buffer 131 in FIG. 2) is placed in the signal path between the third node and the main core processor. For controlling the timing of the plurality of test signals fed into the shadow core processor, a third shadow buffer (e.g., buffer 231 in FIG. 2) is placed in the signal path between the third node and the shadow core processor.

The plurality of data signals flows through a common data signal path. At a fourth node (e.g., node D in FIGS. 1-2), the plurality of data signals is routed to two different signal paths connected to the main core processor and the shadow core processor, respectively. For controlling the timing of the plurality of data signals fed into the main core processor, a fourth main buffer (e.g., buffer 141 in FIG. 2) is placed in the signal path between the fourth node and the main core processor. For controlling the timing of the plurality of data signals fed into the shadow core processor, a fourth shadow buffer (e.g., buffer 241 in FIG. 2) is placed in the signal path between the fourth node and the shadow core processor.

Both the main core processor and the shadow core processor process the received signals. The output of the main core processor is compared with the output of the shadow core processor at a fault control unit (e.g., fault control unit 106 shown in FIGS. 1-2). The fault control unit determines whether the output signal of the main core processor matches the output signal of the shadow core processor. If the outputs of these core processors do not match to each other, it indicates there is a fault in the dual-core lockstep system. The dual-core lockstep system enters into a predetermined safe mode to prevent the propagation of the fault.

In operation, glitches may occur in the common signal paths. The conventional dual-core configuration cannot detect the glitches because the glitches are fed into both the main core processor and the shadow simultaneously. The following steps are employed to suppress the glitches occurred in the common signal paths.

At step 402, a first glitch suppression buffer (e.g., first glitch suppression buffer 115 shown in FIG. 2) is placed at an end of a first common signal path to suppress glitches of a first signal before the first signal flows into two different signal paths coupled to a main core processor and a shadow core processor, respectively. The first signal is the clock signal. The first common signal path is a common clock signal path. The first glitch suppression buffer is placed at the end of the common clock signal path before the clock signal is routed to the two different signal paths.

At step 404, a second glitch suppression buffer (e.g., second glitch suppression buffer 125 shown in FIG. 2) is placed at an end of a second common signal path to suppress glitches of a second signal before the second signal flows into two different signal paths coupled to the main core processor and the shadow core processor, respectively. The second signal is the reset signal. The second common signal path is a common reset signal path. The second glitch suppression buffer is placed at the end of the common reset signal path before the reset signal is routed to the two different signal paths.

At step 406, a third glitch suppression buffer (e.g., third glitch suppression buffer 135 shown in FIG. 2) is placed at an end of a third common signal path to suppress glitches of a third signal before the third signal flows into two different signal paths coupled to the main core processor and the shadow core processor, respectively. The third signal comprises a plurality of test signals. The third common signal path is a common test signal path. The third glitch suppression buffer is placed at the end of the common test signal path before the plurality of test signals is routed to the two different signal paths.

Although embodiments of the present disclosure and its advantages have been described in detail, it should be understood that various changes, substitutions, and alterations can be made herein without departing from the spirit and scope of the disclosure as defined by the appended claims.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a main core processor configured to receive a plurality of signals, each signal received through a respective main buffer coupled to an input of the main core processor;
a shadow core processor configured to receive the plurality of signals, each signal received through a respective shadow buffer coupled to an input of the shadow core processor; and
a first glitch suppression buffer coupled to a common node of an input of a first main buffer and an input of a first shadow buffer, wherein the first glitch suppression buffer comprises a first NAND gate, a second NAND gate, a third NAND gate, a fourth NAND gate, and a delay buffer, a first input of the first NAND gate coupled to a first input of the second NAND gate and an output of the delay buffer, a second input of the first NAND gate coupled to a first input of the third NAND gate and an output of the fourth NAND gate, a second input of the second NAND gate coupled to a second input of the third NAND gate and an input of the delay buffer, and an output of the first NAND gate, an output of the second NAND gate, and an output of the third NAND gate coupled to a respective input of the fourth NAND gate.

2. The apparatus of claim 1, wherein a signal in the plurality of signals is a clock signal, the signal received at an input of the first glitch suppression buffer.

3. The apparatus of claim 1, further comprising a second glitch suppression buffer coupled to a common node of an input of a second main buffer and an input of a second shadow buffer.

4. The apparatus of claim 3, wherein a signal in the plurality of signals is a reset signal, the signal received at an input of the second glitch suppression buffer.

5. The apparatus of claim 3, wherein a signal in the plurality of signals includes test signals, the signal received at an input of the second glitch suppression buffer.

6. The apparatus of claim 3, wherein a signal in the plurality of signals includes data signals, the signal received at an input of the second glitch suppression buffer.

7. The apparatus of claim 1, further comprising a comparator, a first input of the comparator coupled to an output of the main core processor, a second input of the comparator coupled to an output of the shadow core processor, the comparator configured to:
compare an output signal of the main core processor with an output signal of the shadow core processor; and
determine whether the output signal of the main core processor matches the output signal of the shadow core processor.

8. The apparatus of claim 7, wherein the main core processor, the shadow core processor, and the comparator form a dual-core lockstep system.

9. A method, comprising:
suppressing, by a first glitch suppression buffer, glitches in a clock signal received at a first input of a main core processor and a first input of a shadow core processor, the clock signal received from the first glitch suppression buffer through a first main buffer and a first shadow buffer, respectively, coupled to the first input of the main core processor and the first input of the shadow core processor;
suppressing, by a second glitch suppression buffer, glitches in a reset signal received at a second input of the main core processor and a second input of the shadow core processor, the reset signal received from the second glitch suppression buffer through a second main buffer and a second shadow buffer, respectively, coupled to the second input of the main core processor and the second input of the shadow core processor; and
suppressing, by a third glitch suppression buffer, glitches in test signals received at a third input of the main core processor and a third input of the shadow core processor, the test signals received from the third glitch suppression buffer through a third main buffer and a third shadow buffer, respectively, coupled to the third input of the main core processor and the third input of the shadow core processor,
wherein each of the first glitch suppression buffer, the second glitch suppression buffer, and the third glitch suppression buffer comprises a first NAND gate, a second NAND gate, a third NAND gate, a fourth NAND gate, and a delay buffer,
wherein a first input of the first NAND gate is coupled to a first input of the second NAND gate and an output of the delay buffer,
wherein a second input of the first NAND gate is coupled to a first input of the third NAND gate and an output of the fourth NAND gate,
wherein a second input of the second NAND gate is coupled to a second input of the third NAND gate and an input of the delay buffer, and
wherein an output of the first NAND gate, an output of the second NAND gate, and an output of the third NAND gate is coupled to a respective input of the fourth NAND gate.

10. The method of claim 9, further comprising:
suppressing, by a fourth glitch suppression buffer, glitches in data signals received at a fourth input of the main core processor and a fourth input of the shadow core processor, the data signals received from the fourth glitch suppression buffer through a fourth main buffer and a fourth shadow buffer, respectively, coupled to the fourth input of the main core processor and the fourth input of the shadow core processor.

11. The method of claim 10, further comprising:
comparing an output signal of the main core processor with an output signal of the shadow core processor; and
determining whether the output signal of the main core processor matches the output signal of the shadow core processor.

12. The method of claim 10, further comprising:
delaying the clock signal by the first main buffer;
delaying the reset signal by the second main buffer;
delaying the test signals by the third main buffer; and
delaying the data signals by the fourth main buffer.

13. The method of claim 10, further comprising:
delaying the clock signal by the first shadow buffer;
delaying the reset signal by the second shadow buffer;
delaying the test signals by the third shadow buffer; and
delaying the data signals by the fourth shadow buffer.

14. A system comprising:
a main core processor configured to receive a plurality of signals, each signal received through a respective main buffer coupled to an input of the main core processor;
a shadow core processor configured to receive the plurality of signals, each signal received through a respective shadow buffer coupled to an input of the shadow core processor;
a first glitch suppression buffer comprising a first NAND gate, a second NAND gate, a third NAND gate, a fourth NAND gate, and a delay buffer, the first glitch suppression buffer configured to suppress glitches in a clock signal received at a first input of the main core processor and a first input of the shadow core processor;
a second glitch suppression buffer configured to suppress glitches in a reset signal received at a second input of the main core processor and a second input of the shadow core processor;
a third glitch suppression buffer configured to suppress glitches in test signals received at a third input of the main core processor and a third input of the shadow core processor; and
a fourth glitch suppression buffer configured to suppress glitches in data signals received at a fourth input of the main core processor and a fourth input of the shadow core processor,
wherein a first input of the first NAND gate is coupled to a first input of the second NAND gate and an output of the delay buffer,
wherein a second input of the first NAND gate is coupled to a first input of the third NAND gate and an output of the fourth NAND gate,
wherein a second input of the second NAND gate is coupled to a second input of the third NAND gate and an input of the delay buffer, and
wherein an output of the first NAND gate, an output of the second NAND gate, and an output of the third NAND gate is coupled to a respective input of the fourth NAND gate.

15. The system of claim 14, further comprising:
a main buffer coupled between an output of the first glitch suppression buffer and the first input of the main core processor, the main buffer configured to delay the clock signal; and
a shadow buffer coupled between the output of the first glitch suppression buffer and the first input of the shadow core processor, the shadow buffer configured to delay the clock signal.

16. The system of claim 14, further comprising:
a main buffer coupled between an output of the second glitch suppression buffer and the second input of the main core processor, the main buffer configured to delay the reset signal; and
a shadow buffer coupled between the output of the second glitch suppression buffer and the second input of the shadow core processor, the shadow buffer configured to delay the reset signal.

17. The system of claim 14, further comprising:
a main buffer coupled between an output of the third glitch suppression buffer and the third input of the main core processor, the main buffer configured to delay the test signals; and
a shadow buffer coupled between the output of the third glitch suppression buffer and the third input of the shadow core processor, the shadow buffer configured to delay the test signals.

18. The system of claim 14, further comprising:
a main buffer coupled between an output of the fourth glitch suppression buffer and the fourth input of the main core processor, the main buffer configured to delay the data signals; and
a shadow buffer coupled between the output of the fourth glitch suppression buffer and the fourth input of the shadow core processor, the shadow buffer configured to delay the test signals.

19. The system of claim 14, further comprising a comparator, a first input of the comparator coupled to an output of the main core processor, a second input of the comparator coupled to an output of the shadow core processor, the comparator configured to:
compare an output signal of the main core processor with an output signal of the shadow core processor; and
determine whether the output signal of the main core processor matches the output signal of the shadow core processor.

20. The system of claim 19, wherein the main core processor, the shadow core processor, and the comparator form a dual-core lockstep system.

* * * * *